United States Patent
Baba et al.

(10) Patent No.: US 8,840,408 B2
(45) Date of Patent: Sep. 23, 2014

(54) CRANK-SHAPED BOARD TERMINAL WITH A PROTRUDING SUPPORT PORTION

(71) Applicant: Sumitomo Wiring Systems, Ltd., Yokkaichi (JP)

(72) Inventors: Akira Baba, Yokkaichi (JP); Tatsuya Oka, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 54 days.

(21) Appl. No.: 13/652,065

(22) Filed: Oct. 15, 2012

(65) Prior Publication Data
US 2013/0115790 A1    May 9, 2013

(30) Foreign Application Priority Data
Nov. 9, 2011  (JP) ................... 2011-245113

(51) Int. Cl.
| | | |
|---|---|---|
| H01R 12/58 | (2011.01) | |
| H05K 1/11 | (2006.01) | |
| H01R 13/11 | (2006.01) | |
| H05K 3/34 | (2006.01) | |
| H05K 1/02 | (2006.01) | |
| H01R 9/28 | (2006.01) | |

(52) U.S. Cl.
CPC ............... *H01R 12/58* (2013.01); *H05K 1/116* (2013.01); *H05K 1/0296* (2013.01); *H05K 2201/10295* (2013.01); *H01R 13/112* (2013.01); *H05K 3/3447* (2013.01); *H01R 9/28* (2013.01)
USPC .......................................................... 439/83

(58) Field of Classification Search
CPC .... H01R 4/242; H01R 4/2433; H01R 4/2425; H01R 4/2429; H01R 4/2404; H01R 4/24; H01R 12/67
See application file for complete search history.

(56) References Cited

U.S. PATENT DOCUMENTS

| | | | | |
|---|---|---|---|---|
| 6,000,973 | A * | 12/1999 | Mitra ........................... | 439/825 |
| 6,305,950 | B1 * | 10/2001 | Doorhy ....................... | 439/76.1 |
| 6,431,903 | B1 * | 8/2002 | Dittmann et al. ............ | 439/395 |
| 6,612,880 | B2 * | 9/2003 | Arnett et al. ................ | 439/825 |
| 6,891,463 | B2 | 5/2005 | Nagaoka | |
| 8,052,483 | B1 * | 11/2011 | Straka et al. ................ | 439/676 |
| 2002/0055304 | A1 * | 5/2002 | Arnett et al. ................ | 439/825 |
| 2003/0171024 | A1 * | 9/2003 | Mossner et al. ............ | 439/404 |
| 2004/0092154 | A1 * | 5/2004 | Doorhy et al. ............. | 439/404 |
| 2005/0250372 | A1 * | 11/2005 | Doorhy et al. ............. | 439/404 |
| 2012/0231664 | A1 * | 9/2012 | Straka et al. ............. | 439/620.22 |

FOREIGN PATENT DOCUMENTS

JP   A-2003-217437   7/2003

* cited by examiner

*Primary Examiner* — Chandrika Prasad
(74) *Attorney, Agent, or Firm* — Oliff PLC (57) ABSTRACT

A board terminal has a flat-plate shaped connection portion to be connected to an electric component at one end and an insertion portion to be inserted in and soldered to a through-hole of a printed circuit board at the other end and is formed in a crank shape by being provided with a support plate portion protruding in a plate thickness direction of the connection portion between the connection portion and the insertion portion. Also, the insertion portion is formed in a location on only one side in a width direction of the support plate portion.

8 Claims, 7 Drawing Sheets

CRANK-SHAPED BOARD TERMINAL WITH A PROTRUDING SUPPORT PORTION

This application claims priority to JP 2011-245113, which was filed on Nov. 9, 2011.

This application relates to a board terminal soldered to a printed circuit board and connected to an electric component and a printed circuit board provided with such board terminals.

BACKGROUND

Board terminals are used to connect printed wirings provided on a printed circuit board and electric components, such as fuses and relays. Such a board terminal is connectable to an electric component in a connection portion provided at one end and inserted in and soldered to a through-hole of the printed circuit board in an insertion portion provided at the other end. The board terminals are then soldered to the printed circuit board at locations corresponding to terminals of fuses or relays and form electric component attachment portions, such as fuse attachment portions or relay attachment portions.

Incidentally, when an electric component, for example, a fuse is connected, a force in a push-in direction toward the printed circuit board is applied to the board terminal. Accordingly, there is a possibility that stress concentrates and cracking occurs in a soldered portion of the board terminal.

Due to the possibility of cracking occurring in the soldered portion of the board terminal, board terminals of a crank shape provided with a support plate portion protruding in a plate thickness direction of the connection between the connection portion and the insertion portion are used extensively. See JP-A-2003-217437 (Patent Document 1). By allowing the support plate portions to be in contact with the printed circuit board, it becomes possible to support the board terminals against a push-in force when an electric component is connected.

SUMMARY

Figure 9:
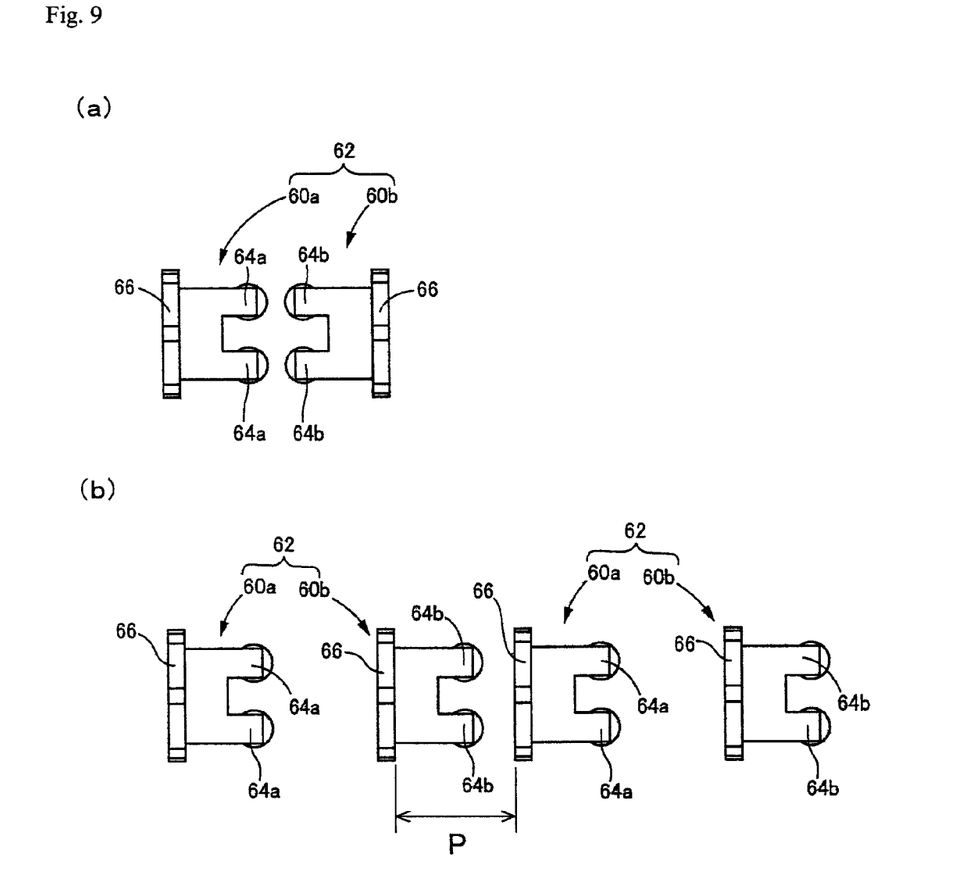
FIG. 9 is a top view used to describe a board terminal having a structure in the related art.

The board terminals described above, however, are configured in such a manner that the support plate portion protrudes in the plate thickness direction of the connection portion and a pair of insertion portions that are symmetric with respect to a center of the support plate portion in a width direction is provided to the support plate portion in a protruding edge portion protruding from the connection portion. Hence, as is shown in FIG. 9A, when a fuse attachment portion 62 is formed by oppositely installing a pair of board terminals 60a and 60b in a plate thickness direction of connection portions 66 with all of own insertion portions 64a and 64b positioned on an inner side in the opposing direction, the insertion portions 64a and 64b are too close to each other and there is a possibility that soldering both board terminals 60a and 60b could cause a short-circuit. In order to overcome this disadvantage, as is shown in FIG. 9B, the insertion portions 64b of at least one board terminal 60b have to be positioned on an outer side in the opposing direction. Accordingly, there is a limit to shorten a distance P between the adjacent fuse attachment portions 62 (spacing distance between the connection portions 66).

Exemplary embodiments in this application were devised in view of the foregoing circumstances and has an object to provide a board terminal of a novel structure that can be installed more space efficiently and a printed circuit board of a novel structure provided with such board terminals.

Exemplary embodiments of the board terminal have a flat-plate shaped connection portion to be connected to an electric component at one end of the board terminal. The board terminal also has an insertion portion to be inserted in and soldered to a through-hole of a printed circuit board at the other end of the board terminal. The board terminal is formed in a crank shape by being provided with a support plate portion protruding in a plate thickness direction of the connection portion between the connection portion and the insertion portion. The insertion portion is formed in a location on only one side in a width direction of the support plate portion.

The insertion portion of the board terminal is inserted into and soldered to the through-hole of the printed circuit board and formed on only one side in the width direction of the support plate portion; that is, only one side of the support plate portion, in the width direction, includes an insertion portion. Accordingly, even in a case where a pair of the board terminals is oppositely installed in the plate thickness direction of the connection portion with the insertion portions positioned on an inner side, the respective insertion portions are positioned alternately. Hence, the insertion portions do not abut on each other in an opposing direction of the both board terminals. It thus becomes possible to solder both board terminals while reducing the possibility of creating a short circuit while the insertion portions are positioned on the inner side in the opposing direction. In this configuration, it becomes possible to form electric component attachment portions for fuses or the like without having to protrude the insertion portions on the outer side. Consequently, a plurality of electric component attachment portions can be spaced closer to one another.

Also, according to an exemplary embodiment of the board terminal, the insertion portion is preferably formed only on one side of the connection portion in the width direction. Hence, the board terminal occupies a smaller area on the printed circuit board, which ensures a larger effective area of the printed circuit board. In particular, in a fuse attachment portion where an eddy current is expected to flow, it is necessary to form a wide printed wiring for a large current. By using the board terminal according to the exemplary embodiment, it becomes possible to advantageously secure a routing space for such a wide printed wiring.

In an exemplary embodiment of the board terminal, the board terminal is configured such that the connection portion has a U shape formed of a pair of pressure-contact blades positioned oppositely with a clearance in between each of the pressure-contact blades. The shape of the board terminal when viewed in projection from one side in the plate thickness direction and the shape of the board terminal when viewed in projection from the other side in the plate thickness direction are identical.

Because of the structure described above, fuses, relays and the like can be connected by sandwiching a board terminal with a pair of the press-contact blades. Thus, it becomes easier to connect and disconnect electric components, such as fuses and relays. Because the connection portion is of identical shapes when viewed from either side in the plate thickness direction, the board terminal can be connected to an electrical component even when the board terminal is installed in either orientation. Thus, there is more freedom in the layout of the board terminal on the electric component.

In exemplary embodiments, a printed circuit board is provided with board terminals with insertion portions of the board terminals being inserted in and soldered to through-holes. A fuse attachment portion is formed by oppositely installing a pair of the board terminals in the plate thickness direction of the connection portion with the insertion portions positioned on an inner side in an opposing direction.

In exemplary embodiments, a fuse attachment portion of the printed circuit board is formed by oppositely installing the board terminals having the insertion portions positioned on the inner side in the opposing direction. Accordingly, it becomes possible to form the fuse attachment portion without having the insertion portions of the board terminals protrude on the outer side. Consequently, another fuse attachment portion and relay attachment portion can be formed in closer proximity to the firstly-mentioned fuse attachment portion, which makes it possible to enhance space efficiency.

In exemplary embodiments, the insertion portion inserted in and soldered to the through-hole is formed on only one side in the width direction. Owing to this configuration, it becomes possible to oppositely install a pair of the board terminals space efficiently with the own insertion portions positioned on the inner side while reducing the possibility of a short circuit. Also, in an exemplary embodiment, a fuse attachment portion is formed by oppositely installing a pair of the board terminals without having to protrude the insertion portions on the outer side. It thus becomes possible to efficiently create space for a plurality of fuse attachment portions and place them closer to one another.

DETAILED DESCRIPTION OF THE EMBODIMENTS

Hereinafter, exemplary embodiments will be described with reference to the drawings.

Figure 3:
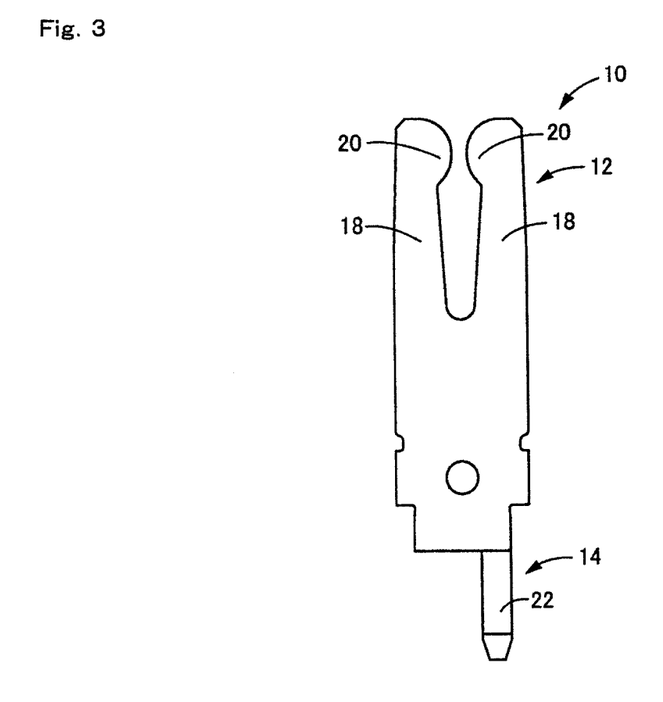
FIG. 3 is a rear view of the board terminal shown in FIG. 1.
Figure 4:
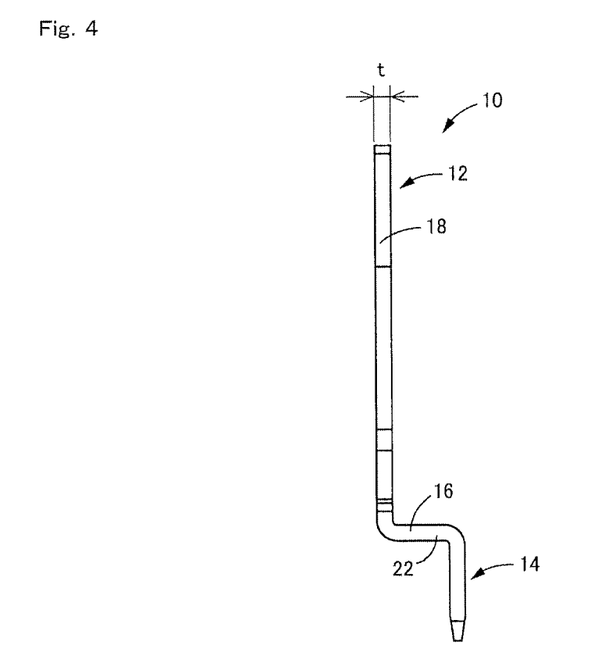
FIG. 4 is a side view of the board terminal shown in FIG. 1.
Figure 5:
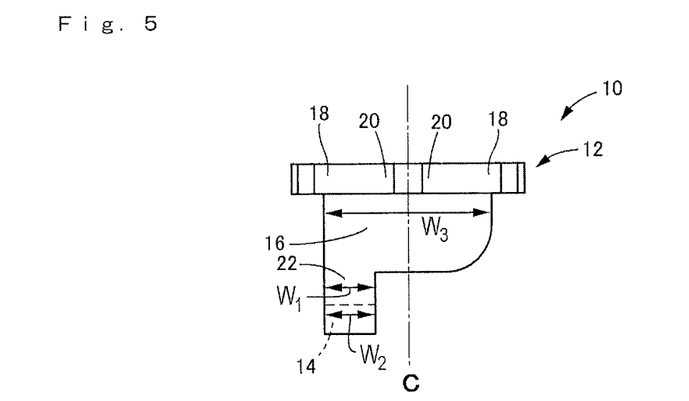
FIG. 5 is a top view of the board terminal shown in FIG. 1.

Firstly, a board terminal 10 according to an exemplary embodiment relating to a board terminal is shown in FIG. 1 through FIG. 5. For ease of understanding, FIG. 5 is shown on a larger scale than FIG. 1 through FIG. 4. In descriptions below, the term "vertical direction" means a top-bottom direction of FIG. 2 and the term "width direction" means a left-right direction of FIG. 2. Also, the term "plate thickness direction" means a left-right direction of FIG. 4.

The board terminal 10 is formed by applying punching work and bending work to a metal plate. A connection portion 12 is formed at one end of the board terminal 10 and an insertion portion 14 is formed at the other end. Also, a support plate portion 16 of a flat-plate shape protruding in a plate thickness direction of the connection portion 12 (left-right direction of FIG. 4) is formed between the connection portion 12 and the insertion portion 14. Owing to this configuration, the board terminal 10 as a whole is of a crank shape in which the connection portion 12 and the insertion portion 14 protrude from the both edge portions of the support plate portion 16 in directions opposite to each other.

Figure 1:
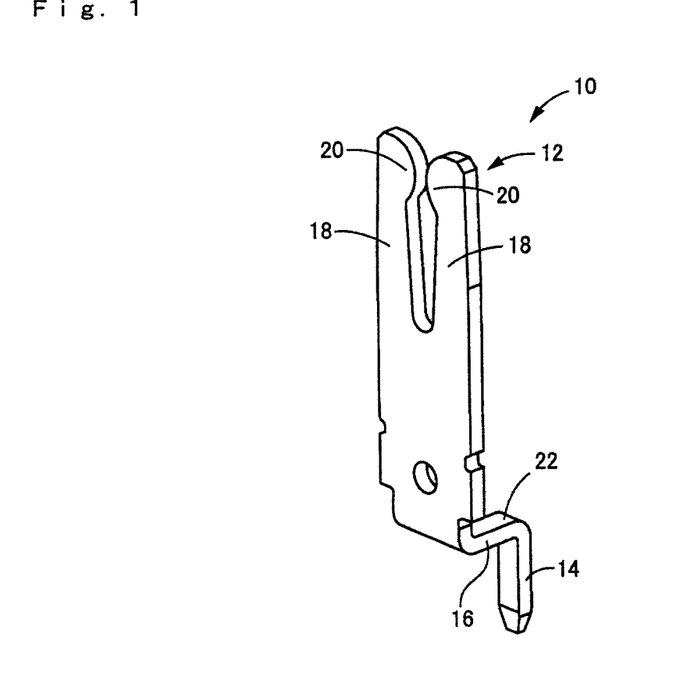
FIG. 1 is a perspective view of a board terminal according to an exemplary embodiment.
Figure 2:
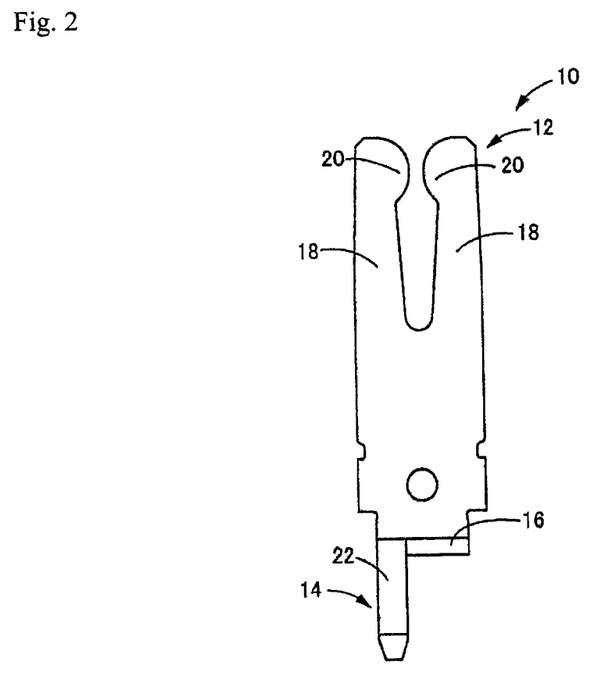
FIG. 2 is a front view of the board terminal shown in FIG. 1.

The connection portion 12 has a fork shape substantially similar to a capital U in which a pair of press-contact blades 18 extending upward is positioned opposite one another with a clearance in between. Contact protrusions 20 slightly protruding toward the counterpart press-contact blade 18 are formed in upper edge portions of the respective press-contact blades 18 and 18. These contact protrusions 20 are positioned oppositely to each other with a clearance in between. As shown in FIG. 4, the press-contact blades 18 are formed to have a constant plate thickness dimension t and the connection portion 12 is of a flat-plate shape having the constant plate thickness dimension t. Also, as are shown in FIG. 2 and FIG. 3, the shape of the connection portion 12 (see FIG. 2) when viewed in projection from one side (from the right side of FIG. 4) in the plate thickness direction (left-right direction of FIG. 4) and is identical to the shape (see FIG. 3) when viewed in projection from the other side (from the left side of FIG. 4).

Meanwhile, the support plate portion 16 has a substantially flat-plate shape protruding on one side (rightward in FIG. 4) in the plate thickness direction of the connection portion 12 and spreading orthogonally to the protruding direction (upward in FIG. 4) of the connection portion 12. The support plate portion 16 is formed along the board terminal 10 in a width direction.

The insertion portion 14 is formed on the edge portion of the support plate portion 16 on an opposite side to the connection portion 12. The insertion portion 14 has a protruding piece shape extending in a direction opposite the protruding direction of the connection portion 12. A protruding piece 22 extends in the plate thickness direction of the connection portion 12 from one edge portion of the support plate portion 116 in the width direction. The insertion portion 14 is formed by bending a protruding piece 22 at an intermediate portion downward substantially at right angles. The board terminal 10 is provided with only one insertion portion 14 and the insertion portion 14 is formed in one edge portion of the support plate portion 16 in the width direction (left-right direction of FIG. 5). The board terminal 10 is provided with the insertion portion 14 formed in the support plate portion 16 only on one side in the width direction by being on one side (leftward in FIG. 5) from a center of the support plate portion 16 in the width direction, C. Also, an edge portion at a corner of the support plate portion 16 on an opposite side (right side of FIG. 5) to the insertion portion 14 in the width direction is shaped like an arc of about ¼ circle by rounding off the corner. Accordingly, even in a case where the side of the edge portion is pressed against a printed circuit board 24 described below at the insertion portion 14 fixed by soldering as a fulcrum when a fuse or the like is connected to the board terminal 10, an abutting force to the printed circuit board 24 is dispersed by an arc shape of the edge portion so that digging of the support plate portion 16 into the printed circuit board 24 is lessened. It should be appreciated, however, that the edge portion may be square. The protruding piece 22 has a width W1; the insertion portion 14 has a width W2 and the supporting plate portion 16 has a width W3. The width W1 of the protruding piece 22 is substantially equal to the width of the insertion portion W2 and both widths W1 and W2 differ from the width W3 of the supporting plate portion 16.

Figure 6:
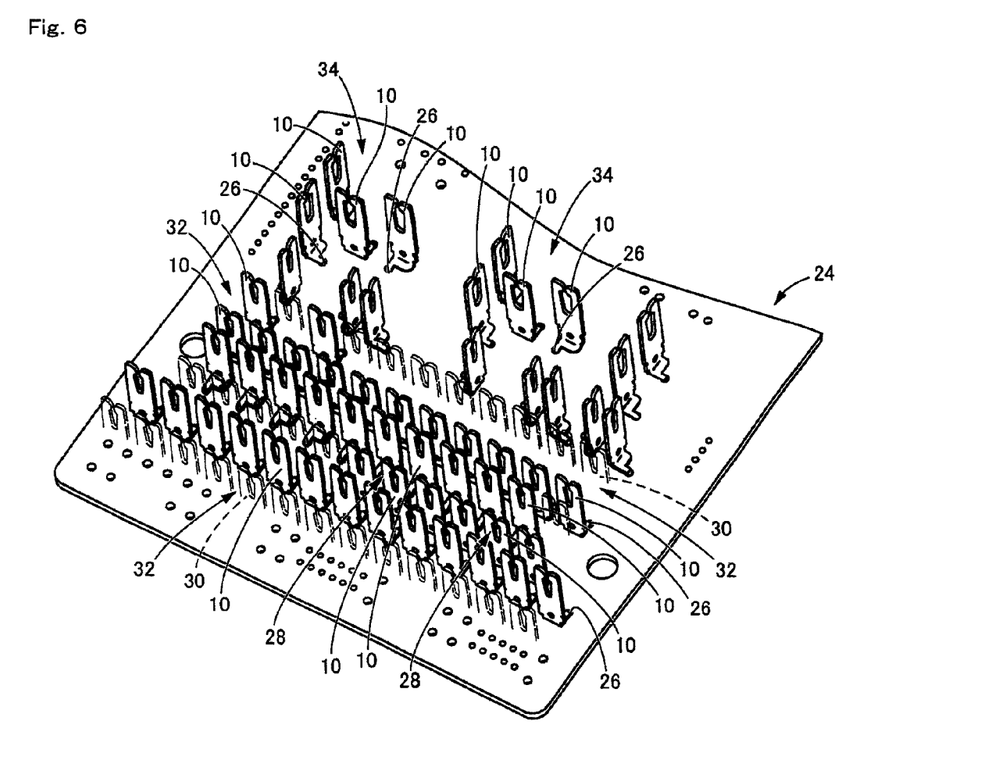
FIG. 6 is a perspective view of a printed circuit board according to an exemplary embodiment.

As in the printed circuit board 24 according to an exemplary embodiment relating to a printed circuit board provided with board terminals shown in FIG. 6, the board terminal 10 as above forms an electric component attachment portion, such as a fuse attachment portion 28 to which a fuse (not shown) as an electric component is attached, by inserting and soldering the insertion portion 14 into a through-hole 26 provided to penetrate through the printed circuit board 24. When the board terminals 10 are soldered to the printed circuit board 24, the board terminals 10 are inserted into terminal insertion holes of a jig (not shown) from the side of the connection portions 12 and thereby set to the jig with the insertion portions 14 protruding from the jig. Thereafter, the insertion portions 14 of the respective board terminals 10 protruding from the jig are inserted into the corresponding through-holes 26 by placing the printed circuit board 24 on top of the jig. The board terminal 10 of this embodiment has only one insertion portion 14. Hence, there is a possibility that the board terminal 10 rotates about the insertion portion 14 while the insertion portion 14 is inserted into the through-hole 26. However, when the terminal insertion hole of the jig is formed in a long rectangular shape, it becomes possible to suppress rotations of the board terminal 10 by inserting the board terminal 10 into the terminal insertion hole. It thus becomes possible to secure positioning accuracy, By soldering the insertion portions 14 inserted into the through-holes 26, the respective board terminals 10 are soldered to the printed circuit board 24 and can be therefore connected to printed wirings (not shown) provided to the printed circuit board 24.

The printed circuit board 24 of this embodiment is housed in a case of a junction box of an automobile and forms an internal circuit of the junction box. As is shown in FIG. 6, the printed circuit board 24 is provided with the fuse attachment portion 28 by oppositely installing a pair of the board terminals 10. Also, a bus bar is provided on the printed circuit board 24 via an illustrated insulating plate. A fuse attachment portion 32 is formed by installing a terminal portion 30 formed in the bas bar in substantially the same shape as the connection portion 12 and indicated by a dotted line in the drawing oppositely to the board terminal 10. A plurality of the fuse attachment portions 28 and 32 are formed and aligned in three rows in an opposing direction of the board terminals 10 and 10. Fuses (not shown) are to be connected to these fuse attachment portions 28 and 32. A fuse is connected to the board terminal 10 by sandwiching a terminal of the fuse between the press-contact blades 18 and 18 in the connection portion 12 of the board terminal 10. The support plate portion 16 comes into contact with the printed circuit board 24 when the fuse is connected to the board terminal 10 and thereby supports the connection portion 12 against a pushing force at the time of connection. It thus becomes possible to reduce the possibility of cracking in solder and deformation of the board terminal 10.

Figure 7:
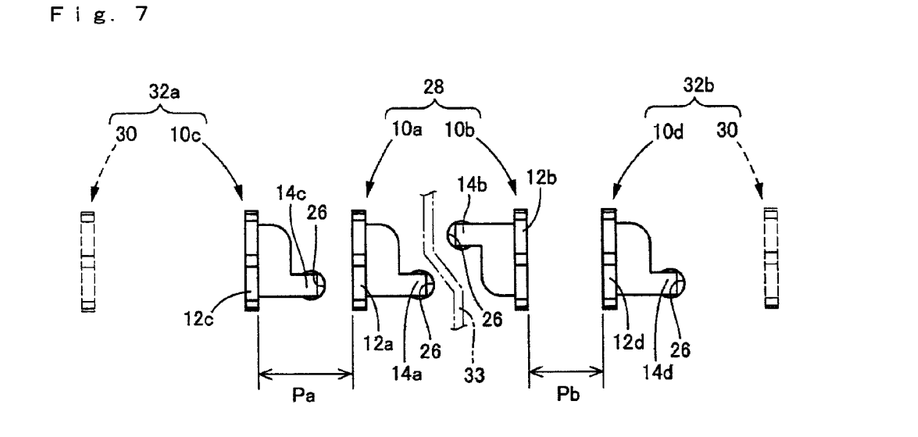
FIG. 7 is an enlarged top view of a major portion of the printed circuit board shown in FIG. 6.

As in FIG. 7 showing an enlarged part of the printed circuit board 24, the fuse attachment portion 28 is formed by oppositely installing a pair of board terminals 10*a* and 10*b* at a predetermined distance in the plate thickness direction of the connection portion 12 (left-right direction of FIG. 7). The board terminals 10*a* and 10*b* are oppositely installed with own insertion portions 14*a* and 14*b* on the inner side in the opposing direction (left-right direction of FIG. 7). Insertion portions 14*a* and 14*b* of the both board terminals 10*a* and 10*b*, respectively, are installed between a connection portion 12*a* of the board terminal 10*a* and a connection portion 12*b* of the board terminal 10*b*. Because the insertion portions 14*a* and 14*b* are formed on only one side in the width direction of the board terminals 10*a* and 10*b*, respectively, the insertion portions 14*a* and 14*b* are positioned alternately while the board terminals 10*a* and 10*b* are installed oppositely. Hence, only one of the insertion portion 14*a* and the insertion portion 14*b* is present on a straight line extending in the opposing direction of the board terminals 10*a* and 10*b* and the insertion portions 14*a* and 14*b* are installed without abutting on each other in the opposing direction of the board terminals 10*a* and 10*b*.

Also, at positions shown in FIG. 7, a fuse attachment portion 32*a* formed by combining a board terminal 10*c* and a terminal portion 30*a* of the bus bar and a fuse attachment portion 32*b* formed by combining a board terminal 10*d* and a terminal portion 30*b* of the bus bar are provided on the both sides of the fuse attachment portion 28 formed by combining a pair of the board terminals 10*a* and 10*b*. The board terminal 10*a* of the fuse attachment portion 28 and the board terminal 10*c* of the fuse attachment portion 32*a* are installed adjacently and the insertion portion 14*c* of the board terminal 10*c* protrudes toward the board terminal 10*a*. The connection portion 12*c* of the board terminal 10*c* and the connection portion 12*a* of the board terminal 10*a* are installed at a predetermined distance Pa in the opposing direction of the board terminals 10*a* and 10*b* (left-right direction of FIG. 7) with the insertion portion 14*c* of the board terminal 10*c* in between. Meanwhile, the board terminal 10*b* of the fuse attachment portion 28 and the board terminal 10*d* of the fuse attachment portion 32*b* are installed adjacently and the insertion portion 14*d* of the board terminal 10*d* protrudes toward an opposite side to the board terminal 10*b*. Owing to this configuration, the connection portion 12*d* of the board terminal 10*d* and the connection portion 12*b* of the board terminal 10*b* are installed at a predetermined distance Pb in the opposing direction of the board terminals 10*a* and 10*b* (left-right direction of FIG. 7) without the insertion portion 14*d* nor the insertion portion 14*b* in between. The spacing distance Pb between the connection portion 12*b* and the connection portion 12*d* installed oppositely without the insertion portions 14*b*, 14*d*, and the like in between is set smaller than the spacing distance Pa between the connection portion 12*a* and the connection portion 12*c* installed oppositely with the insertion portion 14*c* in between.

According to the board terminal 10 having the structure of this embodiment, the insertion portion 14 inserted in and soldered to the through-hole 26 is formed on only one side in the width direction. Accordingly, as is shown in FIG. 7, a pair of the board terminals 10*a* and 10*b* can be installed oppositely with the own insertion portions 14*a* and 14*b* positioned on the inner side reducing the possibility of a short circuit. It thus becomes possible to form the fuse attachment portion 28 without having to protrude the insertion portions 14*a* and 14*b* to the outer side of a space between the connection portions 12*a* and 12*b*. Consequently, the fuse attachment portion 32*b* can be formed by installing the board terminal 10*d* adjacently to the board terminal 10*b* of the fuse attachment portion 28 at a smaller spacing distance Pb without the insertion portion 14*b* in between. Also, according to the printed circuit board 24 of this embodiment, because the fuse attachment portion 28 is formed by using the board terminals 10 as above, it becomes possible to form a plurality of the fuse attachment portions 28 and 32 space efficiently at a smaller spacing distance Pb.

Also, because the board terminal 10 is provided with only one insertion portion 14, one through-hole 26 is sufficient. It thus becomes possible to ensure a larger effective area of the printed circuit board 24. In particular, as is shown in FIG. 7, even in a case where a pair of the board terminals 10*a* and 10*b* is installed oppositely with the both insertion portions 14*a* and 14*b* positioned on the inner side, it becomes possible to ensure a routing space for a printed wiring 33 between the both board terminals 10*a* and 10*b*.

Further, the connection portion 12 of the board terminal 10 is formed in such a manner so as to have identical shapes when viewed from either side in the plate thickness direction. Owing to this configuration, it becomes possible to connect the connection portions 12 to an electric component even when the insertion portions 14 protrude in direction opposite to each other in consideration of a manner in which the printed wirings are routed and a manner in which other components are installed. Hence, a higher degree of freedom in layout can be obtained. Accordingly, it becomes possible to install the insertion portions 14a and 14b not to protrude from the fuse attachment portion 28 as the board terminals 10a and 10b forming the fuse attachment portion 28 shown in FIG. 7 and it also becomes possible to install the insertion portion 14c so as to protrude to the outer side of the fuse attachment portion 32a as the board terminal 10c forming the fuse attachment portion 32a.

It should be appreciated that the board terminal 10 of this embodiment is not necessarily used for the fuse attachment portion. For example, the printed circuit board 24 shown in FIG. 6 is provided with a plurality of relay attachment portions 34 by installing a plurality of the board terminals 10 correspondingly to connection terminals of relays (not shown) as electric components. With the use of the board terminals 10 having the structure of this embodiment, it is sufficient to provide only one through-hole 26 for each board terminal 10. Hence, it becomes possible to form the relay attachment portions 34 while securing a larger effective area of the printed circuit board 24.

Figure 8:
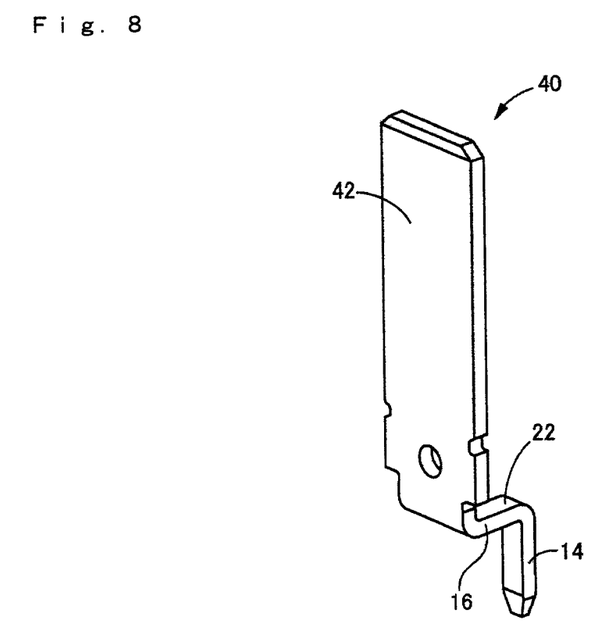
FIG. 8 is a perspective view of a board terminal according to another exemplary embodiment.

FIG. 8 shows a board terminal 40 according to an exemplary embodiment relating to a board terminal. The board terminal 40 is of substantially the same shape as the board terminal 10 of the exemplary embodiment discussed above except for a connection portion 42. Hence, a description of portions other than the connection portion 42 is omitted herein by labeling such portions with the same reference numerals as the board terminal 10 in the drawing. The connection portion 42 of the board terminal 40 is of so-called a tab shape substantially like a rectangular flat plate protruding from the support plate portion 16 with a constant plate thickness dimension and a constant width dimension. By aligning such board terminals 40 in a plurality of rows, it becomes possible to form connector attachment portions to which connectors (not shown) as electric components are attached, and connectors (not shown) can be connected to the connection portions 42 of the respective board terminals 40. With the board terminal 40 shown in FIG. 8, it is also possible for two board terminals 40 installed oppositely and each forming an adjacent individual connector attachment portion to have the own insertion portions 14 positioned on the inner side in the opposing direction. Owing to this configuration, it becomes possible to shorten pitches between adjacent individual connector attachment portions and to ensure a large empty space in the printed circuit board on the periphery of the connector attachment portions. Various shapes can be adopted as a specific shape of the connection portions depending on electric components to be connected.

While a several embodiments have been described in detail, it should be appreciated that the application is not limited to the detailed descriptions above. For example, the board terminals 10 and 40 of the embodiments above are provided with the insertion portion 14 so as to protrude from one edge portion of the support plate portion 16 in the width direction. However, it is sufficient to provide the insertion portion of the board terminal to the support plate portion in a location on one side in the width direction and the insertion portion is not necessarily provided in the edge portion. More specifically, in a case where a pair of the board terminals 10 or the board terminals 40 is installed oppositely with the own insertion portions 14 positioned on the inner side, the insertion portions 14 may be provided to position on slightly inner side than the edge portion of the support plate portion 16 in the width direction within a range to secure a spacing distance long enough to prevent a short circuit between the insertion portions 14 and 14.

Also, the insertion portion 14 is not limited to one as in the embodiments above. For example, a plurality of the insertion portions 14 may be formed so as to protrude from the support plate portion 16 at a plurality of points on one side in the width direction, for example, in the edge portion in the width direction of the support plate portion 16 and also in a portion spaced apart from the edge portion slightly to the inner side. When configured in this manner, it becomes possible to enhance stability of the board terminal in a standing state on the board. In a case where a plurality of the insertion portions are provided, a plurality of fine through-holes may be provided to the printed circuit board or a plurality of the insertion portions may be inserted into a single through-hole from the viewpoint of facilitating the manufacturing.

What is claimed is:

1. A board terminal comprising:
    a flat-plate shaped connection portion to be connected to an electric component at a first end; and
    an insertion portion to be inserted in and soldered to a through-hole of a printed circuit board at a second end that is opposite the first end, wherein:
        the board terminal has a crank shape, and includes a support plate portion protruding in a plate thickness direction of the connection portion, the support plate portion being located between the connection portion and the insertion portion, and
        the insertion portion is formed on only one side in a width direction of the support plate portion, and the other side of the support plate portion, in the width direction, includes no insertion portion, and
        the insertion portion has a width that is substantially equal to a width of a portion of the protrusion portion.

2. The board terminal according to claim 1, wherein:
    the connection portion has a U shape comprising a pair of pressure-contact blades positioned on opposing sides with a clearance in between such that a first shape of the connection portion, when viewed in projection from one side in the plate thickness direction, and a second shape of the connection portion, when viewed in projection from the other side in the plate thickness direction, are identical.

3. A printed circuit board provided with board terminals, each board terminal being a board terminal according to claim 1, with insertion portions of the board terminals being inserted in and soldered to through-holes, wherein:
    a fuse attachment portion is formed by installing a pair of the board terminals on opposing sides in the plate thickness direction of the connection portion, defining an inner side and an outer side, the insertion portions of each of the board terminals being positioned on the inner side.

4. The printed circuit board of claim 3, wherein the insertion portions of each of the board terminals are positioned such that the insertion portions of a first board terminal alternate with the insertion portions of a second board terminal.

5. The board terminal according to claim 1, further comprising:
    a first edge that extends longitudinally from the connection portion to the insertion portion; and a second edge that extends longitudinally, the first edge opposing the second edge, the insertion portion being adjacent to the second edge.

6. The board terminal according to claim 1, wherein the connection portion further comprises a pair of contact protrusions that are positioned on opposing sides, the pair of contact protrusions each having a first width.

7. The board terminal according to claim 6, wherein the connection portion further comprises a pair of press contact blades that are positioned on opposing sides, the pair of press contact blades each having a second width, the first width being larger than the second width.

8. The board terminal according to claim 1, wherein the connection portion has a substantially rectangular shape and substantially constant thickness.

* * * * *